(12) United States Patent
Lin

(10) Patent No.: US 6,306,558 B1
(45) Date of Patent: Oct. 23, 2001

(54) METHOD OF FORMING SMALL CONTACT HOLES USING ALTERNATIVE PHASE SHIFT MASKS AND NEGATIVE PHOTORESIST

(75) Inventor: Hua-Tai Lin, Yu-Kang (TW)

(73) Assignee: Taiwan Semiconductor Manufacturing Company, Hsin-Chu (TW)

(*) Notice: Subject to any disclaimer, the term of this patent is extended or adjusted under 35 U.S.C. 154(b) by 0 days.

(21) Appl. No.: 09/301,221

(22) Filed: Apr. 29, 1999

(51) Int. Cl.[7] ........................................ G03F 7/20
(52) U.S. Cl. ............................. 430/312; 430/394
(58) Field of Search ........................ 430/311, 394, 430/5, 312

(56) References Cited

U.S. PATENT DOCUMENTS

| | | |
|---|---|---|
| 5,498,579 | 3/1996 | Borodovsky et al. ............ 437/250 |
| 5,573,634 * | 11/1996 | Ham ............................ 156/659.11 |
| 5,702,848 | 12/1997 | Spence ................................ 430/5 |
| 5,786,115 * | 7/1998 | Kawabata et al. ..................... 430/5 |
| 5,798,203 | 8/1998 | Haraguchi et al. ................. 430/325 |
| 5,863,677 * | 1/1999 | Nakao ................................... 430/5 |
| 5,905,020 * | 5/1999 | Hu et al. .............................. 430/5 |
| 5,958,656 * | 9/1999 | Nakao ................................ 430/394 |
| 6,001,717 * | 12/1999 | Lien .................................. 438/586 |

* cited by examiner

Primary Examiner—Kathleen Duda
(74) Attorney, Agent, or Firm—George O. Saile; Stephen B. Ackerman; Larry J. Prescott

(57) ABSTRACT

A phase shifting mask set and method of suing the phase shifting mask set to pattern a layer of negative photoresist. The mask set comprises a first phase shifting mask and a second phase shifting mask. The first phase shifting mask has regions of 90° phase shift and −90° phase shift in the contact hole regions of the mask. The second phase shift mask also has regions of 90° phase shift and −90° phase shift in the contact hole regions of the mask. In the second phase shift mask the 90° phase shift regions are rotated 90° spatially with respect to the 90° phase shift regions of the first phase shift mask and the −90° phase shift regions are rotated 90° spatially with respect to the −90° phase shift regions of the first phase shift mask. A layer of negative photoresist is exposed with the first and second phase shift masks and developed to form the photoresist pattern used to form contact holes.

10 Claims, 7 Drawing Sheets

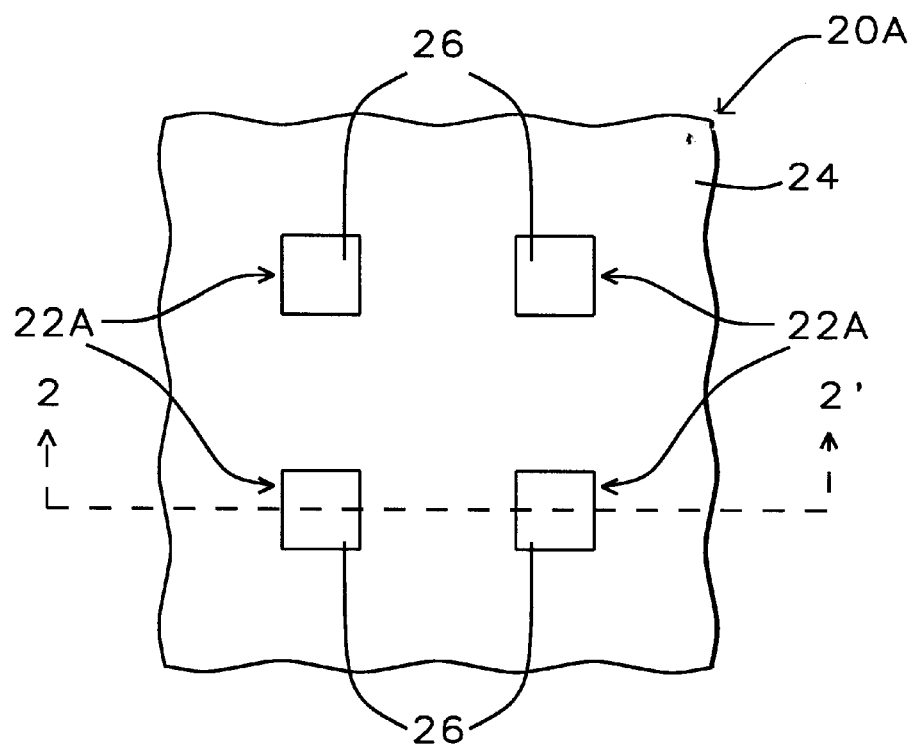
*FIG. 1 – Prior Art*
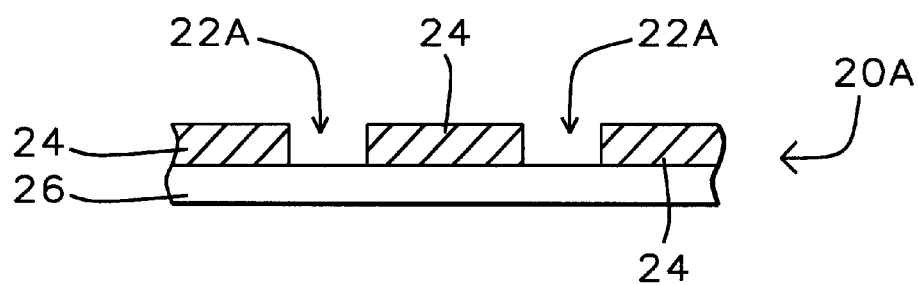
*FIG. 2 – Prior Art*

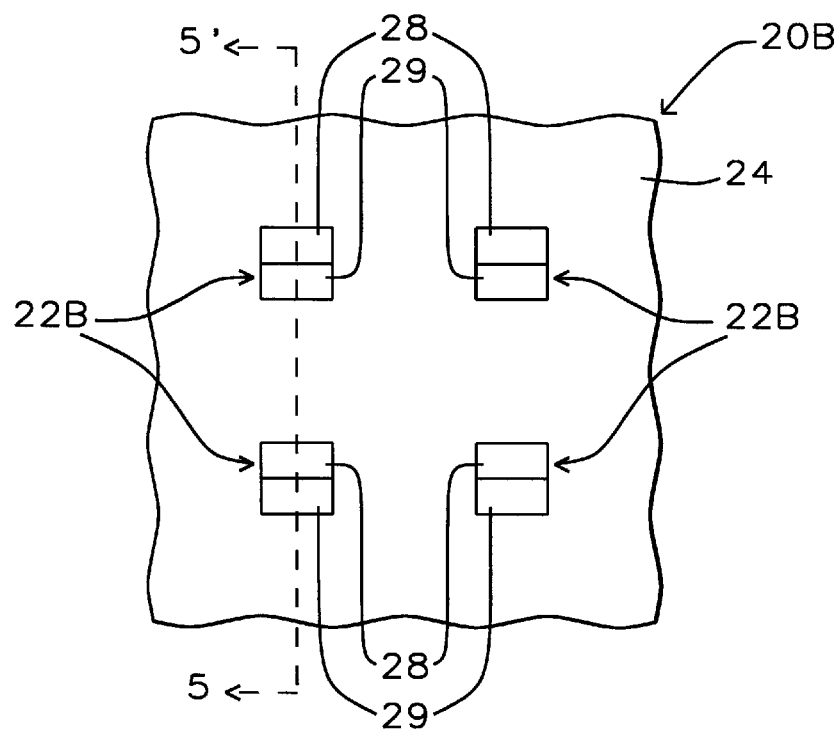
FIG. 3 — Prior Art
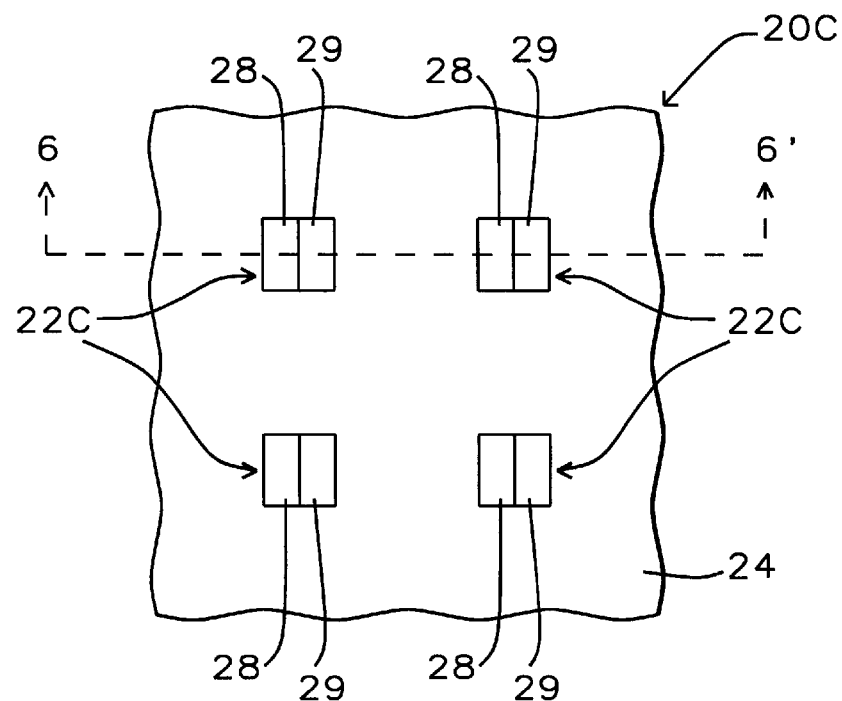
FIG. 4 — Prior Art

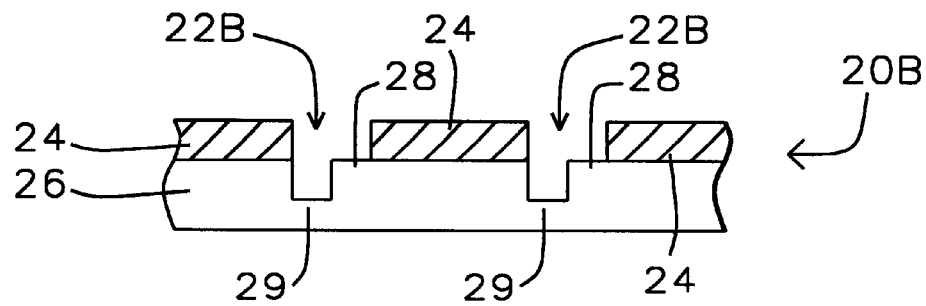
FIG. 5 - Prior Art
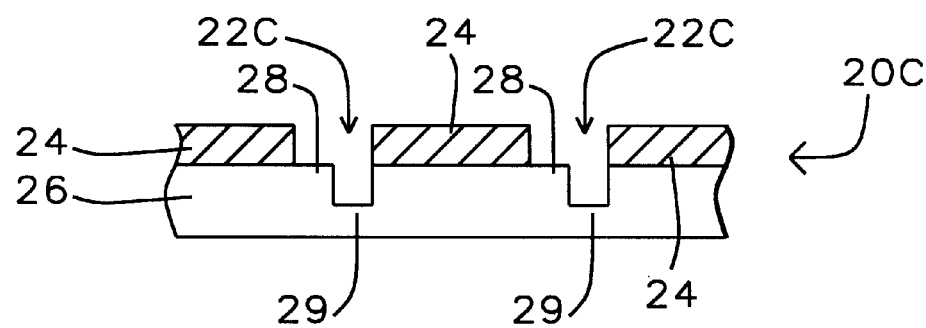
FIG. 6 - Prior Art

METHOD OF FORMING SMALL CONTACT HOLES USING ALTERNATIVE PHASE SHIFT MASKS AND NEGATIVE PHOTORESIST

BACKGROUND OF THE INVENTION (1) Field of the Invention

This invention relates to alternative phase shifting masks for patterning a layer of negative photoresist to form a contact hole mask and to a method of using the alternative phase shifting masks to pattern a layer of negative photoresist to form a contact hole mask.

(2) Description of the Related Art

Conventional binary masks have been used to form contact hole masks in a layer of photoresist. As the contact holes become smaller phase shifting masks have been used to pattern the photoresist.

U.S. Pat. No. 5,498,579 to Borodovsky describes multiple exposures of a photosensitive layer to improve resolution in the patterning of the photosensitive layer.

U.S. Pat. No. 5,702,848 to Spence describes the use of phase shift masks using step regions that compensate for 0° to 180° transition effects.

U.S. Pat. No. 5,798,203 to Haraguchi et al. describes a method of forming a photoresist image using two exposures of the photoresist. The resist used in a positive resist and is exposed. The exposed resist is then changed in its character by baking the substrate in an amine gas to make an exposed portion insoluble in developer. An unexposed portion of the positive resist is then exposed a second time.

SUMMARY OF THE INVENTION

In order to form electrical connections between wiring layers separated by a layer of interlevel dielectric or to form electrical connections to integrated circuits it is necessary to form contact holes or via holes through layers of dielectric material. As the dimensions of these contact holes or via holes becomes smaller the conventional binary mask no longer produces contact holes or via holes of adequate quality. In these situations phase shifting masks are frequently used. Conventional phase shifting masks used for formation of contact holes or via holes require masks having layers of opaque as well as phase shifting material and are complex masks compared to the binary masks. Defects in the part of the mask covered by opaque material will cause problems when the masks are used to form contact holes or via holes.

FIGS. 1 and 2 show a conventional binary mask used to expose a layer of photoresist in order to fabricate contact holes in an integrated circuit wafer. FIG. 1 shows the top view of a conventional binary mask 20A used for contact holes showing the contact hole regions 22A formed in the layer of opaque material 24 exposing the transparent mask substrate 26 beneath the layer of opaque material. FIG. 2 shows a cross section of the conventional binary mask 20A taken along line 2—2' of FIG. 1. FIG. 2 shows the layer of opaque material 24 formed on the transparent mask substrate 26 with the contact hole regions 22A formed in the layer of opaque material 24.

FIGS. 3–6 show a set of two conventional phase shifting masks, 20B and 20C, used to expose a layer of photoresist in order to fabricate contact holes in an integrated circuit wafer. FIG. 3 shows a top view and FIG. 5 a cross section view of the first mask 20B. The first mask 20B has a layer of opaque material 24 formed on a transparent mask substrate with contact hole regions 22B formed in the layer of opaque material 24. Each of the contact hole regions 22B has a first region 28 and a second region 29. Part of the transparent mask substrate 26 is removed from the second region so that the transparent mask substrate material remaining in the first region 28 provides a 180° phase shift to light passing through the first region 28 relative to light passing through the transparent mask substrate material remaining in the second region 29. FIG. 4 shows a top view and FIG. 6 a cross section view of the second mask 20C. The second mask 20C has a layer of opaque material 24 formed on a transparent mask substrate with contact hole regions 22C formed in the layer of opaque material 24. Each of the contact hole regions 22C has a first region 28 and a second region 29. Part of the transparent mask substrate 26 is removed from the second region so that the transparent mask substrate material remaining in the first region 28 provides a 180° phase shift to light passing through the first region 28 relative to light passing through the transparent mask substrate material remaining in the second region 29. As can be seen in FIGS. 3 and 4 the region of the first mask providing a 180° phase shift is rotated 90° with respect to the region of the second mask providing a 180° phase shift.

FIG. 5 shows a cross section of the conventional first phase shift mask 20B taken along line 5—5' of FIG. 3. FIG. 5 shows the layer of opaque material 24 formed on the transparent mask substrate 26 of the conventional first phase shift mask 20B with the contact hole regions 22B formed in the layer of opaque material 24 of the first mask 20B and part of the transparent mask substrate removed from the second region 29 of the first mask 20B. FIG. 6 shows a cross section of the conventional second phase shift mask 20C taken along line 6—6' of FIG. 4. FIG. 6 shows the layer of opaque material 24 formed on the transparent mask substrate 26 of the second mask 20C with the contact hole regions 22C formed in the layer of opaque material 24 of the second mask 20C and part of the transparent mask substrate 26 removed from the second region 29 of the second mask 20C The conventional first phase shifting mask and the conventional second phase shifting mask are used sequentially to expose a layer of photoresist. The conventional phase shifting masks require a layer of opaque material to form the masks. Defects in the opaque material will adversely affect the photoresist pattern formed using the masks.

It is a principle objective of this invention to provide a phase shifting mask to be used with negative photoresist for the formation of contact holes or via holes which does not require the use of opaque material and is tolerant of mask defects.

It is another principle objective of this invention to provide a method of forming contact hole or via hole patterns in a layer of negative photoresist using phase shifting masks having no opaque material which are tolerant of defects.

These objectives are achieved with two phase shifting masks having no opaque material. These masks are used to expose a layer of negative photoresist. A first phase shifting mask provides a 90° phase shift to light passing through a first half of each of the contact hole regions of the first mask and a 270° phase shift to light passing through the second half of each of the contact hole regions of the first mask. These phase shifts are relative to the remainder of the first mask. A second phase shifting mask provides a 90° phase shift to light passing through a first half of each of the contact hole regions of the second mask and a 270° phase shift to light passing through the second half of each of the contact hole regions of the second mask. These phase shifts are relative to the remainder of the second mask. The first half of each of the contact hole regions of the first mask are rotated 90° with respect to the first half of each of the contact hole regions of the second mask. The second half of each of the contact hole regions of the first mask are rotated 90° with respect to the second half of each of the contact hole regions of the second mask.

A layer of negative photoresist is then exposed by the first mask and by the second mask. The layer of negative photoresist is then developed which removes the unexposed portions of the negative photoresist. The interference patterns at the boundaries of regions of different phase shift form unexposed regions in the contact hole regions of the mask. Since the masks are fabricated entirely from transparent material, defects in the mask in mask regions other than the contact hole regions of the mask are not a concern.

BRIEF DESCRIPTION OF THE DRAWINGS

FIG. 1 shows a top view of a conventional binary mask used to form a pattern for contact holes in a layer of photoresist.

FIG. 2 shows a cross section view of the mask of FIG. 1 along line 2—2' of FIG. 1.

FIG. 3 shows a top view of the first mask of a conventional phase shifting mask set used to form a pattern for contact holes in a layer of photoresist.

FIG. 4 shows a top view of the second mask of a conventional phase shifting mask set used to form a pattern for contact holes in a layer of photoresist.

FIG. 5 shows a cross section view of the mask of FIG. 3 along line 5—5' of FIG. 3.

FIG. 6 shows a cross section view of the mask of FIG. 4 along line 6—6' of FIG. 4.

DESCRIPTION OF THE PREFERRED EMBODIMENTS

Figure 7:
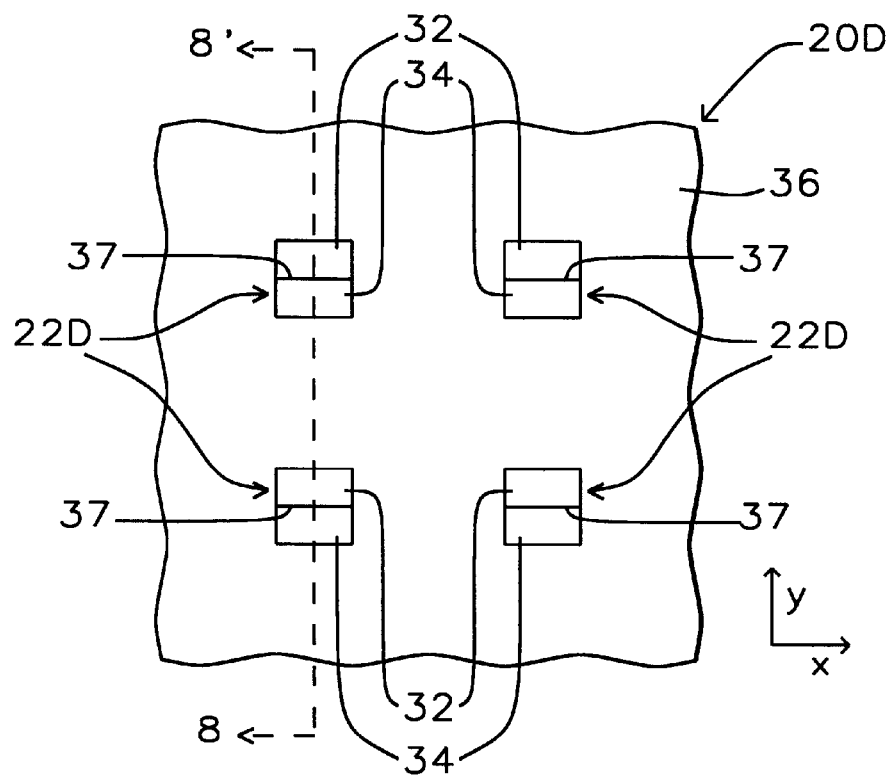
FIG. 7 shows a top view of the first mask of a phase shifting mask set of this invention used to form a pattern for contact holes in a layer of negative photoresist.

Refer now to FIGS. 7–12 for a description of the preferred embodiments of the mask and method of this invention. The phase shift masks of this invention comprises a set of two phase shift masks having phase shifting regions but formed entirely of transparent material. FIG. 7 shows a top view of the first phase shifting mask 20D showing a transparent first background region 36 and a number of first contact hole regions 22D. The first contact hole regions 22D are squares. The first mask 20D has orthogonal X and Y orientation directions associated with it, as shown in FIG. 7. The sides of the first contact hole regions 22D are parallel to either the X or Y directions. Each of the first contact hole regions 22D has a first half region 32 and a second half region 34. There is a first boundary 37 between each of the first half regions 32 and second half regions 34 and the first boundary 37 is parallel to the X direction.

Each of the first half regions 32 provides a 90° phase shift to light having a first wavelength passing through the first half region 32 when compared to light having the first wavelength passing through the transparent first background region 36. Each of the second half regions 34 provides a 270° phase shift to light having the first wavelength passing through the second half region 34 when compared to light having the first wavelength passing through the transparent first background region 36. This produces a 180° phase shift between light having the first wavelength passing through the first half region 32 and light having the first wavelength passing through the second half region 34. The first wavelength is the wavelength of light that will be projected through the mask to expose a layer of negative photoresist. The first wavelength can be, for example, 3650 Angstroms, 2480 Angstroms, 1570 Angstroms, or any other convenient wavelength.

Figure 8:
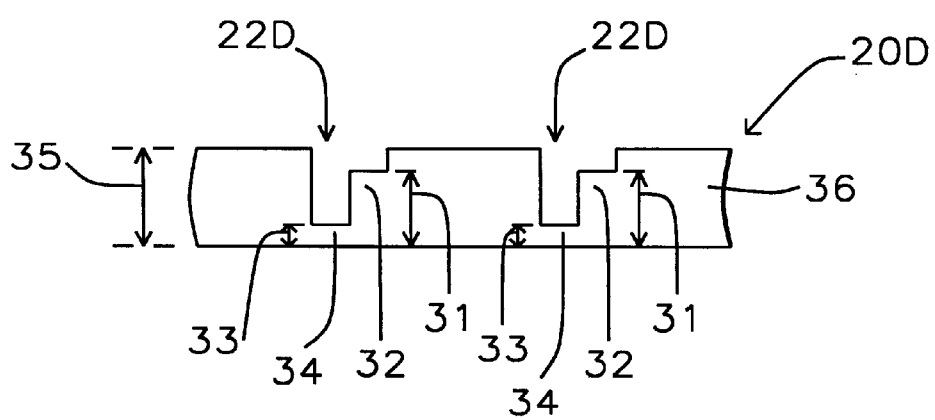
FIG. 8 shows a cross section view of the mask of FIG. 7 along line 8—8' of FIG. 7.

FIG. 8 shows a cross section view of the first phase shifting mask 20D taken along line 8—8' of FIG. 7. FIG. 8 shows that the transparent first background 36 is provided by a transparent mask substrate, formed of a transparent material such as quartz, having a first thickness 35. The first thickness can be, for example, between about 1 millimeter and 20 millimeters. The first half region 32 is formed by removing part of the transparent mask substrate material leaving a second thickness 31 of transparent mask substrate material. The second thickness 31 is chosen to provide to provide a 90° phase shift between light passing through the first half region and light passing through the first background region. The second half region 34 is formed by removing part of the transparent mask substrate material leaving a third thickness 33 of transparent mask substrate material. The third thickness 33 is chosen to provide to provide a 270° phase shift between light passing through the second half region 34 and light passing through the first background region, and a phase shift of 180° between light passing through the second half region 34 and light passing through the first half region 32. The second thickness 31 will be less than the first thickness 35 and greater than the third thickness 33.

Figure 9:
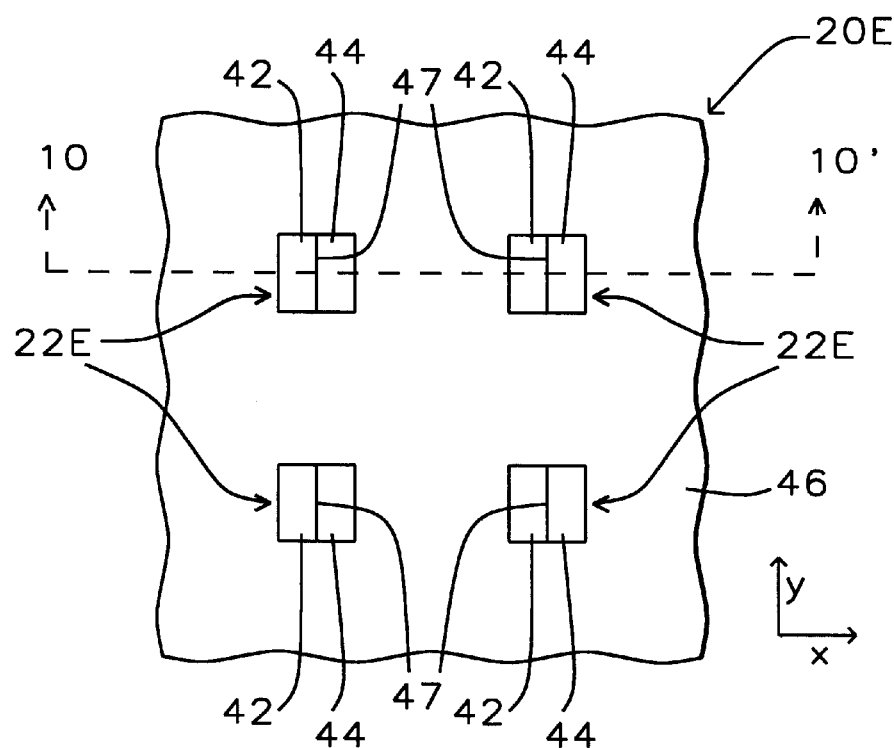
FIG. 9 shows a top view of the second mask of a phase shifting mask set of this invention used to form a pattern for contact holes in a layer of negative photoresist.

FIG. 9 shows a top view of the second phase shifting mask 20E showing a transparent second background region 46 and a number of second contact hole regions 22E. The second contact hole regions 22E are squares and have the same size as the first contact hole regions 22D. The second contact hole regions 22E have the same locations on the second phase shifting mask 20E as the first contact hole regions 22D on the first phase shifting mask 20D. The second mask 20E has the same orthogonal X and Y orientation directions associated with it, as shown in FIG. 9, as the first phase shifting mask 20D. The sides of each of the second contact holes 22E are parallel to either the X or Y directions. Each of the second contact hole regions 22E has a third half region 42 and a fourth half region 44. There is a second boundary 47 between each of the third half regions 42 and fourth half regions 44 and the second boundary 47 is parallel to the Y direction. The first boundary 37 is perpendicular to the second boundary 47.

Each of the third half regions 42 provides a 90° phase shift to light having a first wavelength passing through the third half region 42 when compared to light having the first wavelength passing through the transparent second background region 46. Each of the fourth half regions 44 provides a 270° phase shift to light having the first wavelength passing through the fourth half region 44 when compared to light having the first wavelength passing through the transparent second background region 46. This produces a 180° phase shift between light having the first wavelength passing through the third half region 42 and light having the first wavelength passing through the fourth half region 44. The first wavelength is the wavelength of light that will be projected through the mask to expose a layer of negative photoresist. The first wavelength can be, for example, 3650 Angstroms, 2480 Angstroms, 1570 Angstroms, or any other convenient wavelength.

Figure 10:
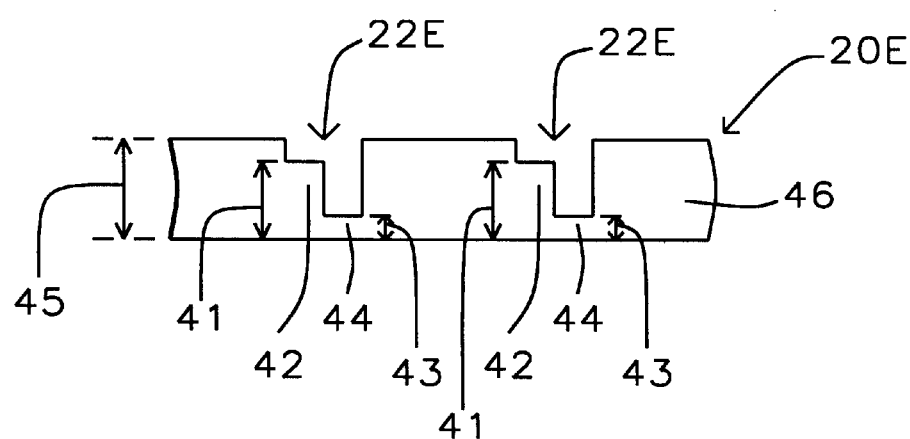
FIG. 10 shows a cross section view of the mask of FIG. 9 along line 10—10' of FIG. 9.

FIG. 10 shows a cross section view of the second phase shifting mask 20E taken along line 10—10' of FIG. 9. FIG. 9 shows that the transparent second background region 46 is a transparent mask substrate, formed of a transparent material such as quartz, having a fourth thickness 45. The transparent second background region is preferably, but not necessarily, the same material having the same thickness as transparent first background region. The fourth thickness can be, for example, between about 1 millimeter and 20 millimeters. The third half region 42 is formed by removing part of the transparent mask substrate material leaving a fifth thickness 41 of transparent mask substrate material. The fifth thickness 41 is chosen to provide to provide a 90° phase shift between light passing through the third half region 42 and light passing through the second background region.

The fourth half region 44 is formed by removing part of the transparent mask substrate leaving a sixth thickness 43 of transparent mask material. The sixth thickness 43 is chosen to provide to provide a 270° phase shift between light passing through the fourth half 44 region and light passing through the second background region 46 and a 180° phase shift between light passing through the fourth half region 44 and light passing through the third half region 42. The fifth thickness 41 will be less than the fourth thickness 45 and greater than the sixth thickness 43.

Figure 11:
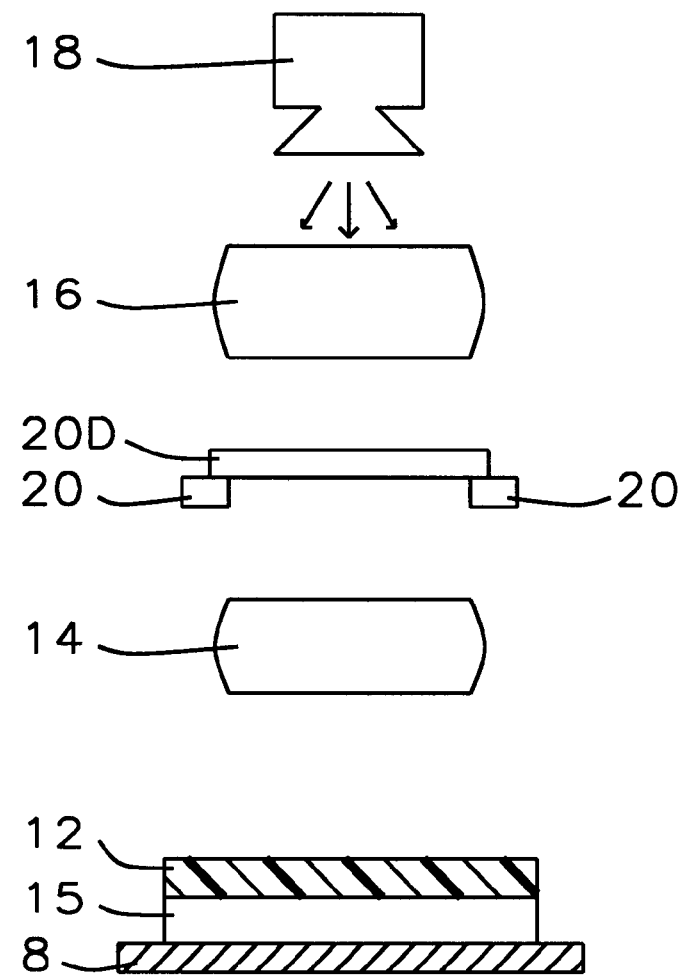
FIG. 11 shows a schematic view of a mask projection system used to expose photoresist on an integrated circuit wafer.

The first phase shifting mask and the second phase shifting mask are used as a set of two masks to expose a layer of negative photoresist. After negative photoresist has been exposed to a pattern developing removes the unexposed portions of the negative photoresist and the exposed portions of the negative photoresist remains. FIG. 11 shows a schematic diagram of a projection exposure system, such as a five times stepper. A condensing lens 16 directs light from a light source 18 to a mask held in a mask holder 20. FIG. 11 shows the first phase shifting mask 20D held in the mask holder 20 for illustration purposes, however those skilled in the art will readily recognize that other masks will be placed in the mask holder during different process steps. A wafer 15 with a layer of negative photoresist 12 formed thereon is placed in a wafer holder 8. Light passing through the mask 20D passes through an objective lens 14 and is focussed on the layer of negative photoresist 12.

First, as shown in FIG. 11, light passing through the first phase shifting mask 20D is focussed on the layer of negative photoresist 12 providing a first exposure for the layer of negative photoresist. Next, the first phase shifting mask 20D is replaced in the mask holder 20 by the second phase shifting mask 20E. Light passing through the second phase shifting mask 20E is then focussed on the layer of negative photoresist 12 providing a second exposure for the layer of second photoresist. The wafer 15 is then removed from the wafer holder and the layer of negative photoresist 12 is developed.

Figure 12:
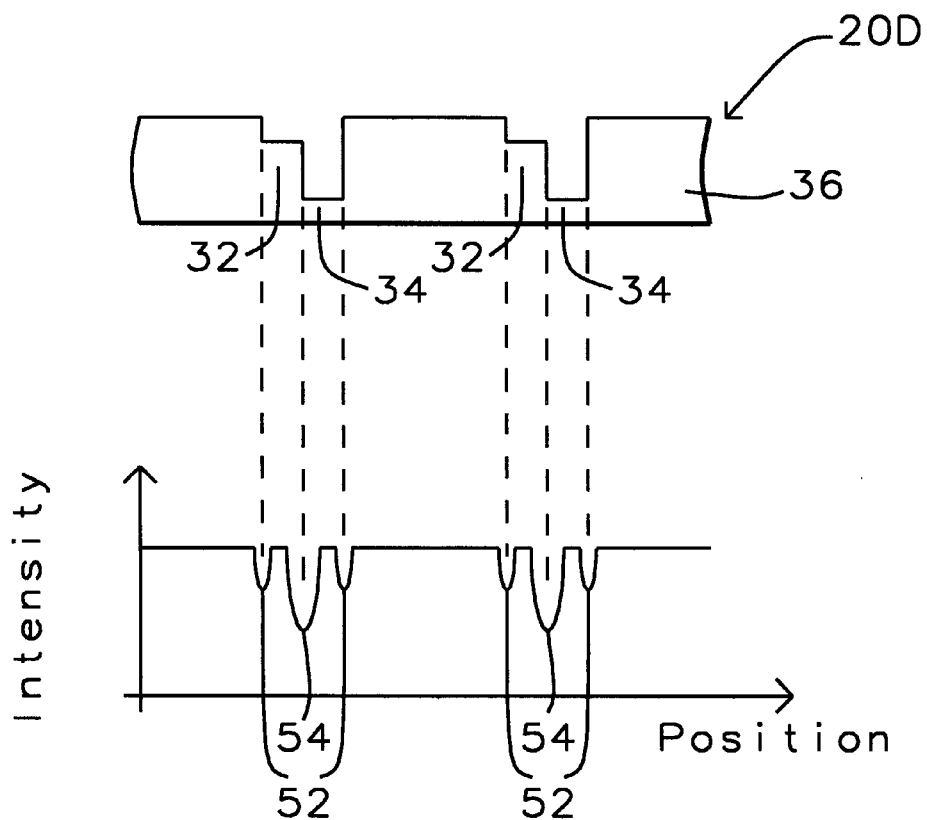
FIG. 12 shows a cross section view of a part of either the first or second mask of the phase shifting mask set of this invention and the intensity at the layer of photoresist of light passing through the mask.

FIG. 12 shows the light intensity 50 as a function of position at the layer of negative photoresist. FIG. 12 shows the light intensity 50 as a function of position relative to the first phase shift mask 20D, however those skilled in the art will recognize that the same pattern applies to the second phase shift mask 20E. The phase shift having a magnitude of 90° at the transition between the first half region 32 and the first background region 36 and between the second half region 34 and the first background region 36 results in first intensity minima 52 at the layer of negative photoresist. The phase shift having a magnitude of 180° at the transition between the first half region 32 and the second half region 34 results in second intensity minima 54, deeper than the first intensity minima, at the layer of negative photoresist. These regions of intensity minima result in unexposed negative photoresist in the contact hole regions. When the negative photoresist, exposed using both the first phase shifting mask and the second phase shifting mask, is developed holes are formed in the negative photoresist. The developed photoresist can then be used to form via holes in the wafer.

The masks of this invention are formed entirely of transparent material. The method of this invention provides a high degree of tolerance for mask defects.

While the invention has been particularly shown and described with reference to the preferred embodiments thereof, it will be understood by those skilled in the art that various changes in form and details may be made without departing from the spirit and scope of the invention.

What is claimed is:

1. A method of forming holes in integrated circuit wafers, comprising:

providing an integrated circuit wafer having a layer of dielectric and a layer of negative photoresist formed thereon;

providing a projection system for holding and positioning a mask, holding and positioning said integrated circuit wafer, and projecting said mask on said layer of negative photoresist using light having a first wavelength;

providing X and Y reference directions wherein said X direction is perpendicular to said Y direction;

providing a first mask formed in a first transparent mask substrate having a first number of square first contact hole regions, wherein said first mask contains no opaque material, each of said square first contact hole regions consists of a first half region having a first thickness and a second half region having a second thickness, the boundaries between said first half region and said second half region in each of said square first contact hole regions are parallel to said X direction, said first thickness provides a 90° phase shift between light having said first wavelength passing through said first mask substrate and light having said first wavelength passing through said first half region, said second thickness provides a 270° phase shift between light having said first wavelength passing through said first mask substrate and light having said first wavelength passing through said second half region, and said first thickness and said second thickness provide a 180° phase shift between light having said first wavelength passing through said first half region and light having said first wavelength passing through said second half region;

providing a second mask formed in a second transparent mask substrate having said first number of square second contact hole regions, wherein said second mask contains no opaque material, each of said square second contact hole regions consists of a transparent third half region having a third thickness and a transparent fourth half region having a fourth thickness, the boundaries between said third half region and said fourth half region in each of said square second contact hole regions are parallel to said Y direction, said third thickness provides a 90° phase shift between light having said first wavelength passing through said second mask substrate and light having said first wavelength passing through said third half region, said fourth thickness provides a 270° phase shift between light having said first wavelength passing through said second mask substrate and light having said first wavelength passing through said fourth half region, and said third thickness and said fourth thickness provide a 180° phase shift between light having said first wavelength passing through said third half region and light having said first wavelength passing through said fourth half region;

placing said integrated circuit wafer in said projection system;

placing said first mask in said projection system;

projecting said first mask on said layer of negative photoresist thereby exposing said layer of negative photoresist with a first exposure;

placing said second mask in said projection system;

projecting said second mask on said layer of negative photoresist thereby exposing said layer of negative photoresist with a second exposure;

removing said integrated circuit wafer from said projection system; and developing said layer of negative photoresist.

2. The method of claim 1 wherein said transparent first mask substrate and said transparent second mask substrate are quartz.

3. The method of claim 1 wherein said transparent first mask substrate and said transparent second mask substrate have a thickness of between about 1 millimeter and 20 millimeters.

4. The method of claim 1 wherein said square second contact hole regions have the same size and orientation as said square first contact hole regions.

5. The method of claim 1 wherein said first mask substrate has the same size and shape as said second mask substrate.

6. The method of claim 1 wherein said square first contact holes have the same location on said first mask substrate as said square second contact holes on said second mask substrate.

7. The method of claim 1 wherein said first thickness and said second thickness are less than the thickness of said transparent first mask substrate.

8. The method of claim 1 wherein said first thickness is greater than said second thickness.

9. The method of claim 1 wherein said third thickness and said fourth thickness are less than the thickness of said transparent second mask substrate.

10. The method of claim 1 wherein said third thickness is greater than said fourth thickness.

* * * * *